(12) United States Patent
Thorseth et al.

(10) Patent No.: US 9,809,891 B2
(45) Date of Patent: Nov. 7, 2017

(54) PLATING METHOD

(71) Applicant: Rohm and Haas Electronic Materials LLC, Marlborough, MA (US)

(72) Inventors: Matthew A. Thorseth, West Minster, MA (US); Mark A. Scalisi, Salem, NH (US); Luis A. Gomez, Holden, MA (US); Bryan Lieb, Carlisle, MA (US); Rebecca Lea Hazebrouck, Salem, NH (US); Mark Lefebvre, Hudson, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/319,526

(22) Filed: Jun. 30, 2014

(65) Prior Publication Data

US 2015/0376807 A1    Dec. 31, 2015

(51) Int. Cl.
| | |
|---|---|
| *C25D 3/38* | (2006.01) |
| *C25D 5/02* | (2006.01) |
| *C25D 7/12* | (2006.01) |
| *H05K 3/42* | (2006.01) |

(52) U.S. Cl.
CPC .............. *C25D 3/38* (2013.01); *C25D 5/02* (2013.01); *C25D 7/123* (2013.01); *H05K 3/423* (2013.01)

(58) Field of Classification Search
CPC .......... C25D 5/02; C25D 3/38; H01L 21/3205
See application file for complete search history.

(56) References Cited

U.S. PATENT DOCUMENTS

| | | | |
|---|---|---|---|
| 3,634,205 A | 1/1972 | Melillo et al. | |
| 4,038,161 A | 7/1977 | Eckles et al. | |
| 4,139,425 A | 2/1979 | Eckles et al. | |
| 4,545,870 A * | 10/1985 | Rosenberg | C25D 3/32 |
| | | | 205/303 |
| 6,776,893 B1 | 8/2004 | Too et al. | |
| 7,232,513 B1 | 6/2007 | Webb et al. | |
| 7,670,950 B2 | 3/2010 | Richardson et al. | |
| 7,776,741 B2 | 8/2010 | Reid et al. | |
| 8,262,895 B2 | 9/2012 | Niazimbetova et al. | |
| 8,268,157 B2 | 9/2012 | Niazimbetova | |
| 8,268,158 B2 | 9/2012 | Niazimbetova et al. | |
| 8,454,815 B2 | 6/2013 | Niazimbetova et al. | |
| 8,747,643 B2 | 6/2014 | Niazimbetova et al. | |
| 9,217,205 B2 | 12/2015 | Abys et al. | |
| 2002/0043468 A1 | 4/2002 | Mikkola et al. | |

(Continued)

FOREIGN PATENT DOCUMENTS

| | | | | |
|---|---|---|---|---|
| CN | 103361681 | * | 10/2013 | ............... C25D 3/38 |
| EP | 2845928 A1 | | 3/2015 | |

(Continued)

OTHER PUBLICATIONS

Chang, S.C., et al., "Role of surface tension in copper electroplating", J. Vac. Sci. Technol. A 25(3), 2007.*
J. Mendez, et al, "Polyether suppressors enabling copper metallization of high aspect ratio interconnects", Journal of The Electrochemical Society, 2009, pp. D474-D479, vol. 156.

(Continued)

*Primary Examiner* — Stefanie S Wittenberg
(74) *Attorney, Agent, or Firm* — S. Matthew Cairns

(57) ABSTRACT

Copper electroplating baths having a surface tension of ≤40 mN/m are suitable for filling vias with copper, where such copper deposits are substantially void-free and substantially free of surface defects.

11 Claims, 2 Drawing Sheets

(56) References Cited

U.S. PATENT DOCUMENTS

| | | |
|---|---|---|
| 2002/0074231 A1 | 6/2002 | Mikkola et al. |
| 2003/0105216 A1* | 6/2003 | Sata .................... C08F 218/04 524/563 |
| 2004/0217009 A1 | 11/2004 | Mikkola et al. |
| 2005/0045386 A1 | 3/2005 | Sahoda et al. |
| 2005/0092611 A1 | 5/2005 | Kim et al. |
| 2006/0141784 A1* | 6/2006 | Paneccasio et al. .......... 438/687 |
| 2007/0178697 A1* | 8/2007 | Paneccasio et al. .......... 438/687 |
| 2012/0211369 A1* | 8/2012 | Park ........................ C25D 3/38 205/118 |
| 2013/0178063 A1 | 7/2013 | Lin et al. |
| 2013/0341199 A1 | 12/2013 | Uchida et al. |
| 2014/0170835 A1 | 6/2014 | Tamboli et al. |
| 2016/0168737 A1* | 6/2016 | Wang ...................... C25D 3/38 205/125 |

FOREIGN PATENT DOCUMENTS

| | | |
|---|---|---|
| WO | 2008157612 A1 | 12/2008 |
| WO | 2012103357 A1 | 8/2012 |

OTHER PUBLICATIONS

Search report corresponding to Taiwan Application No. 104119720 dated Mar. 7, 2016.

Search report for corresponding European Application No. 15 17 3908 dated Nov. 20, 2015.

Search report for corresponding Singapore Application No. 10201504959U dated Dec. 8, 2015.

Search report for corresponding China Application No. 201510368373.9 dated Feb. 20, 2017.

* cited by examiner

PLATING METHOD

The present invention relates generally to a method of depositing metal on a substrate such as an electronic device substrate, and more specifically to a method of electroplating metal into a via on a substrate.

Copper is used extensively in the manufacture of electronic devices, including integrated circuit (IC) devices. For example, copper damascene processes used in the manufacture of integrated circuits involve the formation of inlaid copper wiring patterns with the simultaneous formation of via connections between metal layers. In such processes, the copper is deposited electrolytically. Various copper electroplating formulations have been developed to meet the unique needs of depositing copper in the very small sized features (such as ≤150 nm) used in damascene metallization processes in the manufacture of ICs. Such copper electroplating baths typically require an accelerator, leveler and suppressor as organic additives in order to get defect-free copper deposits.

Recent trends in the semiconductor industry to increase the density of IC devices have lead to three-dimensional (3-D) packages and 3-D ICs, both of which make use of through-silicon vias (TSVs). A TSV is a vertical electrical connection passing through a wafer or die, and are typically formed from copper. Typically, TSVs have a depth of from 5 to 400 μm, a diameter of from 1 to 100 μm, and high aspect ratios, such as from 3:1 to 20:1. The dimensions of TSVs are challenging to fill with copper from a conventional electroplating bath in a reasonable amount of time such that the resulting copper deposit is void-free and free of surface defects. Voids in a TSV copper deposit can lead to circuitry failure. Surface defects require additional polishing to remove them to obtain a planar surface prior to subsequent processing.

Certain copper electroplating baths have been developed specifically to deposit copper in TSVs. For example, U.S. Pat. No. 7,670,950 discloses the void-free filling of TSVs with copper using a copper electroplating bath that does not contain a suppressor. However, this patent does not address the issue of surface defects in such copper deposits. Accordingly, there remains a need for copper electroplating baths that provide void-free deposits that are also free of surface defects.

The present invention provides a composition comprising: a source of copper ions; an acid electrolyte; a source of halide ions; an accelerator; a leveler; and a suppressor; wherein the copper electroplating bath has a dynamic surface tension of ≤40 mN/m; and wherein the copper electroplating bath is acidic. Preferably, the suppressor comprises ethylene oxide as polymerized units, and more preferably the suppressor further comprises an end group formed from a secondary alcohol.

The present invention also provides a method of filling a via in an electronic device with copper comprising: providing an acidic copper electroplating bath comprising a source of copper ions, an acid electrolyte, a source of halide ions, an accelerator, a leveler, and a suppressor, wherein the copper electroplating bath has a surface tension of ≤40 mN/m; providing as a cathode an electronic device substrate having one or more vias to be filled with copper and having a conductive surface; contacting the electronic device substrate with the copper electroplating bath; and applying a potential for a period of time sufficient to fill the vias with a copper deposit; wherein the copper deposit in the vias is substantially void-free and substantially free of surface defects.

Figure 1A:
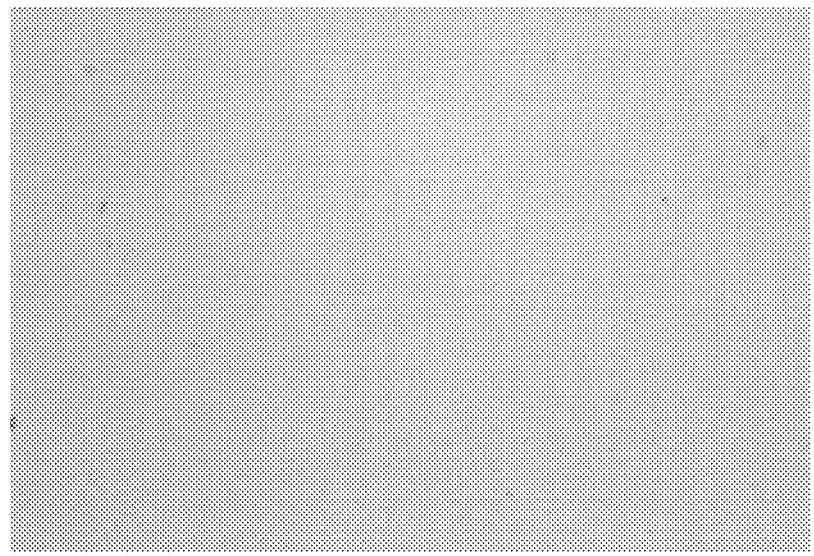
FIGS. 1A and 1B are optical images showing the surface of a copper layer plated from a copper electroplating bath having a suppressor of the invention and a copper electroplating bath having a comparative suppressor, respectively.

As used throughout this specification, the following abbreviations shall have the following meanings, unless the context clearly indicates otherwise: ° C.=degree Celsius; g=gram; mL=milliliter; L=liter; mN=millinewtons; m=meter; dm=decimeter; cm=centimeter; μm=micron=micrometer; nm=nanometer; Å=angstrom; min.=minute; and A=ampere. All amounts are percent by weight ("wt %") and all ratios are weight ratios, unless otherwise noted. All percentages by weight are based on the total weight of the composition, unless otherwise noted. As used herein, "ppm" is on a weight basis, unless otherwise noted. All numerical ranges are inclusive and combinable in any order, except where it is clear that such numerical ranges are constrained to add up to 100%.

The articles "a," "an" and "the" refer to the singular and the plural, unless the context indicates otherwise. "Alkyl" refers to linear, branched and cyclic alkyl. "Aryl" refers to aromatic carbocycles and aromatic heterocycles. As used throughout this specification, the term "plating" refers to electroplating, unless the context clearly indicates otherwise. "Deposition" and "plating" are used interchangeably throughout this specification. "Defects" refer to surface defects of a copper deposit, such as protrusions, pits and swirl defects, as well as voids within the copper deposit. "Accelerator" (also known as "brightener") refers to an organic additive that increases the rate of copper deposition during electroplating. The term "suppressor" (also known as "carrier") refers to an organic additive that suppresses the rate of copper deposition during electroplating. "Leveler" refers to an organic additive that is capable of providing a substantially planar copper deposit. The terms "leveler" and "leveling agent" are used interchangeably throughout this application. The term "halide" refers to fluoride, chloride, bromide and iodide.

The present copper electroplating baths comprise: a source of copper ions; an acid electrolyte; a source of halide ions; an accelerator; a leveler; and a suppressor; wherein the copper electroplating bath has a dynamic surface tension of ≤40 mN/m; and wherein the copper electroplating is acidic. The present copper electroplating baths are acidic, having a pH of <7. Preferably, the electroplating baths of the invention have a pH of ≤2, more preferably <2, and even more preferably ≤1.

Typical sources of copper ions useful in the present electroplating baths are any copper compounds that are soluble in the electroplating bath. Suitable sources of copper ions include, but are not limited to, copper salts such as copper sulfate, copper persulfate, copper halide, copper chlorate, copper perchlorate, copper alkanesulfonates, copper alkanol sulfonate, copper arylsulfonates, copper fluoroborate, cupric nitrate, copper acetate, and copper citrate. Exemplary copper alkanesulfonates include copper methanesulfonate, copper ethanesulfonate, and copper propanesulfonate. Exemplary copper arylsulfonates include copper benzenesulfonate, copper toluenesulfonate, and copper phenolsulfonate. Copper sulfate, copper alkanesulfonates and copper arylsulfonates are preferred, and copper sulfate is most preferred. Mixtures of copper compounds may be used.

Such sources of copper ions are generally commercially available and may be used without further purification. The source of copper ions may be used in the present electroplating baths in a relatively wide concentration range. Typically, the copper ion source is present in an amount sufficient to provide an amount of copper ion in the range of 10 to 80 g/L in the plating bath, preferably from 20 to 80 g/L, and more preferably from 25 to 75 g/L.

Any acid which is compatible with the source of copper ions and the other components may be suitably used as the electrolyte in the present electroplating baths. Suitable acids include, but are not limited to: sulfuric acid; acetic acid; fluoroboric acid; nitric acid; sulfamic acid; phosphoric acid; hydrogen halide acids such as hydrochloric acid; alkanesulfonic acids such as methane sulfonic acid, ethanesulfonic acid and propanesulfonic acid; arylsulfonic acids such as toluenesulfonic acid, phenolsulfonic acid and benzenesulfonic acid; and halogenated acids such as trifluoromethylsulfonic acid and haloacetic acid. Preferably, the acid is sulfuric acid, alkanesulfonic acid or arylsulfonic acid, and more preferably is sulfuric acid. Mixtures of acids may be used. Suitable acids are generally commercially available and may be used without further purification. The acid is used in the present compositions in an amount sufficient to impart conductivity to the electroplating bath. The total amount of acid electrolyte used in the present electroplating baths is typically from 0.01 to 75 g/L, preferably from 0.01 to 50 g/L, and more preferably from 1 to 50 g/L. It will be appreciated that higher amounts of acid may be used for certain applications. It will be further appreciated by those skilled in the art that by using copper sulfate, a copper alkanesulfonate or a copper arylsulfonate as the copper ion source, an acidic electrolyte can be obtained without any separately added acid.

Any suitable halide ions may be used in the present electroplating baths. Chloride and bromide are preferred halide ions, with chloride being more preferred. Mixtures of halide ions may be used, such as a mixture of chloride and bromide ions. A wide range of halide ion concentrations may be utilized, such as from 0.1 to 125 ppm of halide ion in the plating bath, preferably from 25 to 125 ppm, and more preferably from 50 to 100 ppm. Such halides may be added as the corresponding hydrogen halide acid or as any suitable salt that is soluble in the electroplating bath.

A wide variety of accelerators may be employed in the present copper electroplating baths. Preferably, the accelerator is a disulfide-containing compound. Suitable disulfide-containing accelerators have a molecular weight of 5000 or less and preferably 1000 or less. Disulfide-containing accelerators that also have sulfonic acid groups are more preferred, such as those having the formula R'—S—S—R—$SO_3X$, where R is an optionally substituted alkyl, optionally substituted heteroalkyl, or optionally substituted aryl group; X is hydrogen or a counter ion such as sodium or potassium; and R' is hydrogen or an organic residue such as a group of the formula —R—$SO_3X$. Preferably, R is alkyl, more preferably $C_{1-16}$ alkyl, and most preferably unsubstituted $C_{1-8}$ alkyl. Heteroalkyl groups have one or more hetero (N, O or S) atoms in the alkyl chain, and have from 1 to 16 carbons, and preferably from 1 to 8 carbons. The aryl groups are preferably carbocyclic, such as phenyl or naphthyl. Heteroaromatic groups contain 1 to 3 of one or more of N, O and S atoms and 1 to 3 separate or fused rings and include, for example, coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, and benzothiazol. Heteroalkyl groups include heteroalicyclic groups such as groups that have 1 to 3 of one or more of N, O and S atoms and from 1 to 3 separate or fused rings. Substituents of substituted alkyl, heteroalkyl, and aryl groups include, for example, $C_{1-8}$ alkoxy, $C_{1-8}$ alkyl, halogen such as F, Cl and Br; cyano; and nitro. One or more accelerators may be used in the present compositions, and preferably one accelerator is used. Suitable disulfide-containing accelerators are generally commercially available, such as from Raschig, and may be used without further purification.

Preferred disulfide-containing accelerators are those having the formula

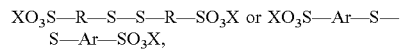

wherein R is an optionally substituted $C_{1-6}$ alkyl; Ar is an optionally substituted aryl group; and X is hydrogen or a suitable counter ion. Preferably, R is an optionally substituted $C_{1-4}$ alkyl, and more preferably a $C_{1-4}$ alkyl. It is preferred that Ar is selected from optionally substituted phenyl and optionally substituted naphthyl, and more preferably from phenyl and naphthyl. Preferred counter ions for X are sodium and potassium. Suitable preferred disulfide-containing accelerators are bis-sulfopropyl disulfide and bis-sodium-sulfopropyl disulfide.

Optionally, an additional accelerator that does not contain a disulfide group may be used in combination with the present disulfide-containing accelerator. Typical additional accelerators contain one or more sulfur atoms and may be, without limitation, thiols, mercaptans, sulfides, and organic sulfonic acids. For example, such additional accelerator compound may have the formula $XO_3S$—R"—SH, wherein R" is an optionally substituted $C_{1-6}$ alkyl group, and preferably an unsubstituted $C_{1-4}$ alkyl; and X is hydrogen or a suitable counter ion such as sodium or potassium. Exemplary additional accelerators are well-known in the art and include, without limitation, N,N-dimethyl-dithiocarbamic acid (3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); 3-(benzthiazolyl-s-thio)propyl sulfonic acid (sodium salt); pyridinium propyl sulfobetaine; 1-sodium-3-mercaptopropane-1-sulfonate; and combinations of the above. Suitable additional accelerators are also described in U.S. Pat. Nos. 3,770,598; 3,778,357; 4,374,709; 4,376,685; 4,555,315; and 4,673,469. Such additional accelerators may be used alone or as a mixture of two or more. It is preferred that the present compositions are free of such additional accelerators.

The amount of the disulfide-containing accelerator present in a freshly prepared copper electroplating bath of the invention is from 0.05 to 500 ppm. Preferably, the disulfide-containing accelerator compound is present in an amount of from 0.1 to 250 ppm, more preferably from 0.5 to 100 ppm, yet more preferably from 0.5 to 50 ppm, and even more preferably from 0.5 to 25 ppm. Any additional accelerators present in the copper electroplating baths of the invention are used the amounts described for the disulfide-containing accelerators.

A wide variety of levelers are known in the art and may suitably be used in the present copper electroplating compositions. Levelers are typically used in the present electroplating compositions in an amount of 0.5 to 500 ppm, preferably from 0.5 to 100 ppm, and more preferably from 0.5 to 50 ppm. Preferably, the leveler is a nitrogen-containing compound. Exemplary levelers include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; reaction products of amines with epoxide-containing compounds; among others known in the art. Such reaction products are generally commercially available, such as from Raschig, or may be prepared by methods known in the art. Such leveler compounds may be used with or without further purification.

Preferred levelers are reaction products of an amine with an epoxide compound such as epihalohydrin, glycidyl ethers, alkane dioxides, cycloalkane dioxides, or other suitable epoxide-containing compounds. Suitable amines include, but are not limited to, primary, secondary or tertiary amines, heterocyclic amines, heteroaromatic amines, and the like. Exemplary amines include, without limitation, dialkylamines, trialkylamines, arylalylamines, diarylamines, imidazole, triazole, tetrazole, benzimidazole, benzotriazole, piperidine, morpholine, piperazine, pyridine, pyrazine, oxazole, benzoxazole, pyrimidine, quinoline, and isoquinoline. Preferably, the amine is a heterocyclic or heteroaromatic, and more preferably heteroaromatic. Imidazole, benzimidazole, pyridine, and pyrazine are preferred amines. Suitable amines may be substituted or unsubstituted. By "substituted", it is meant that one or more of the hydrogens on the amine are replaced by one or more substituent groups, such as alkyl, aryl, alkoxy, halo, and alkenyl. Preferred epoxide compounds are epichlorohydrin, diglycidyl ethers of $C_{1-16}$ alkanes or cycloalkanes, and diepoxide-containing $C_{1-16}$ alkanes or cycloalkanes. Particularly preferred levelers are reaction products of one or more of imidazole, benzimidazole, pyridine, and pyrazine, each of which may be substituted or unsubstituted, with one or more epoxide-containing compound selected from epichlorohydrin, diglycidyl ethers of $C_{1-16}$ alkanes or cycloalkanes, and diepoxide-containing $C_{1-16}$ alkanes or cycloalkanes. Suitable reaction products of amines with epoxide compounds are those disclosed in U.S. Pat. Nos. 4,038,161; 6,610,192; 8,262,895; 8,268,157; 8,268,158; 8,454,815; and 8,747,643. The reaction products of amines with epoxide compounds disclosed in U.S. Pat. Nos. 8,262,895; 8,268,157; 8,268,158; 8,454, 815; and 8,747,643 are preferred. Reaction products of one or more amines with one or more epoxide compounds may be used as levelers in the present compositions.

Any suppressor may be used in the present composition provided that such suppressor provides a copper electroplating bath having a dynamic surface tension of ≤40 mN/m, as measured using a Krüss BP100 bubble tensiometer at a solution temperature of 25° C. and at a surface age of 30 sec. The particular dynamic surface tension of the present copper electroplating baths is not critical as long as it is ≤40 mN/m, and preferably <40 mN/m. There is no particular lower limit to the dynamic surface tension, but a preferred surface tension is in the range of 1 to 40 mN/m, more preferably from 10 to 40 mN/m, yet more preferably from 20 to 40 mN/m, and still more preferably from 20 to 39 mN/m. Suitable suppressors are polymeric materials having ether linkages. As used herein, the term "polymer" includes oligomers. Preferably, the suppressors comprise an alkylene oxide monomer as polymerized units, and have one terminal group formed from an alcohol, preferably an aliphatic alcohol. Exemplary alkylene oxide monomers are ethylene oxide (EO), propylene oxide (PO), butylene oxide, and the like, and mixtures thereof. Ethylene oxide, propylene oxide, and mixtures of ethylene oxide and propylene oxide are preferred, with ethylene oxide and mixtures of ethylene oxide and propylene oxide being more preferred, and ethylene oxide being most preferred. It is preferred that the terminal group is formed from a secondary aliphatic alcohol, and more preferably from a branched secondary aliphatic alcohol. Preferred suppressors are those of the formula RO—[(CH$_2$CH$_2$O)$_n$(CHXCHYO)$_m$]-H wherein R is an aryl, alkyl or alkenyl group containing from 2 to 20 carbons; X and Y are independently hydrogen, methyl or ethyl and where at least one of X and Y is methyl or ethyl; n is an integer from 3 to 500; and m is an integer from 0 to 300. It is preferred that one of X and Y is methyl and the other is hydrogen. Preferably n is an integer from 3 to 100, more preferably from 3 to 50, and even more preferably from 5 to 25. It is preferred that m is an integer from 0 to 200, more preferably from 0 to 150, and yet more preferably m=0. When m is ≥1, that is m=1 to 300, it is preferred that n=m. For example, when m≥1 and n=10, it is preferred that m=10. It is even further preferred that the R—O— moiety is formed from a secondary alcohol, even more preferably from a secondary aliphatic alcohol, and still more preferably from a branched secondary aliphatic alcohol. When the R—O— moiety is formed from a branched secondary aliphatic alcohol, it is preferred that m=0, and that n is an integer from 3 to 50. When the R—O— moiety is not a branched secondary aliphatic alcohol, it is preferred that n is an integer from 3 to 50, m is an integer from 3 to 50, and that n=m, and that the suppressor has a number average molecular weight of ≤4000. It is further preferred that when the R—O— moiety is not a branched secondary aliphatic alcohol that the EO and PO units are not in a block copolymer arrangement, and more preferably the EO and PO units are in a random arrangement. Preferred suppressors have a number average molecular weight of ≤5000, more preferably ≤4000, even more preferably ≤3000, yet more preferably ≤2000, and still more preferably ≤1500. Exemplary suppressors include relatively low molecular weight (≤4000) alkyl EO/PO copolymers such as those sold under the TERGITOL™ XH and TERGITOL™ XD trade names (The Dow Chemical Company), and branched secondary alcohol ethoxylates such as those under the TERGITOL™ TMN-3, TERGITOL™ TMN-6, TERGITOL™ TMN-10 and TERGITOL™ TMN-100 trade names (The Dow Chemical Company). Mixtures of suppressors may be used, provided that the copper electroplating bath has an equilibrium surface tension of ≤40 mN/m and that the electroplating bath remains clear (that is, not cloudy) at temperatures ≤40° C. A preferred mixture of suppressors is a mixture of branched secondary alcohol ethoxylates, such as that sold under the TERGITOL™ TMN-100 trade name.

The suppressor may be added to the present electroplating compositions in any amount that provides a copper electroplating bath that: has a dynamic surface tension of ≤40 mN/m, as measured using a Krüss BP100 bubble pressure tensiometer at 25° C.; remains clear (that is, does not turn cloudy) at a temperature of 30° C. for 2 days; deposits copper in a TSV where the copper deposit is substantially void-free, preferably void-free, and substantially free of surface defects, and more preferably void-free and surface defect-free. As used herein, "substantially void-free" means having no voids ≥0.1 µm dimension before annealing. "Substantially free of surface defects" means having no surface defects >2 µm in any dimension. In general, the amount of suppressor in the present compositions is in the range of from 0.5 to 500 ppm, preferably from 0.5 to 300 ppm, more preferably from 1 to 250 ppm, and yet more preferably from 1 to 100 ppm.

While not preferred, the copper plating baths of the invention may also contain amounts of other alloying elements, such as, but not limited to, tin, zinc, indium, antimony, and the like. Such alloying elements are added to the electroplating baths in the form of any suitable bath-solution salt. Thus, the copper electroplating baths useful in the present invention may deposit copper or copper alloy. Preferably, the copper plating baths of the invention are substantially free of alloying metals, and more preferably free of alloying metals. By "substantially free" is meant that the plating baths contain less than 0.01 ppm of such alloying metals.

The present electroplating baths may be prepared by combining the source of copper ions, acid electrolyte, accelerator, leveler, suppressor, and any optional components in any order. The present copper electroplating baths also contain water. The water may be present in a wide range of amounts. Any type of water may be used, such as distilled, deionized (DI) or tap.

Vias, such as TSVs, in an electronic device substrate can be filled with copper according to the steps of: providing an acidic copper electroplating bath comprising a source of copper ions, an acid electrolyte, a source of halide ions, an accelerator, a leveler, and a suppressor, wherein the copper electroplating bath has a dynamic surface tension of ≤40 mN/m; providing as a cathode an electronic device substrate having one or more vias to be filled with copper and having a conductive surface; contacting the electronic device substrate with the copper electroplating bath; and applying a potential for a period of time sufficient to fill the vias with a copper deposit; wherein the copper deposit in the vias is substantially void-free and substantially free of surface defects.

A wide variety of electronic device substrates may be plated with copper according to the present invention, particularly electronic device substrates useful in 3-D integrated circuits and 3-D packages. Suitable electronic device substrates include those useful in RF devices, MEMs devices CMOS devices, memory devices including flash, DRAM and SRAM, logic devices, and anywhere else a 3-D stack is used. Such substrates are typically wafers or dies having one or more TSVs which, after subsequent, pass completely through a wafer or die. Typically, TSVs have a depth of from 5 to 600 μm, a diameter of from 1 to 200 μm, and high aspect ratios, such as from 3:1 to 20:1, although TSVs may have other suitable dimensions. Aspect ratio is defined as the ratio of the depth of the TSV to the diameter of the TSV at the via opening. The particular size and aspect ratio of a TSV depends on which stage in the overall 3-D process includes the TSV.

TSVs are formed in an electronic device substrate, such as a wafer, using techniques well-known in the art. The TSVs extend from a front surface of the substrate to a back surface of the substrate. The height of the TSV is determined by the thickness of the substrate. The surface of the substrate having active devices thereon is typically referred to as the front surface. As the substrate is non-conductive, the sidewalls of the TSV must be made conductive in order to electrodeposit copper in the via. First, a copper diffusion barrier, such as tantalum, tantalum nitride, tungsten, titanium, titanium nitride, ruthenium, or tungsten titanium, is deposited on the walls of the via, such as by chemical vapor deposition (CVD), atomic layer deposition (ALD), or physical vapor deposition (PVD). Next, a conductive seed layer is deposited on the barrier layer to provide a uniform conductive surface for electroplating. The conductive seed layer may be deposited by CVD, ALD, or PVD techniques.

The electronic device substrate having TSVs are then contacted with the present copper electroplating bath. The electronic device substrate, that is the wafer or die, functions as a cathode. Potential is applied to deposit copper into the TSV and onto the surface of the substrate. Any suitable potential may be used, including pulse current, direct current, reverse periodic current, periodic pulse reverse current, step current or other suitable current, with direct current being preferred. The present electroplating baths may be used at any temperature from 10 to 65° C. or higher. It is preferred that the temperature of the plating baths is from 10 to 35° C. and more preferably from 15 to 30° C. Typically, the present electroplating baths are agitated during use. Any suitable agitation method may be used with the present invention and such methods are well-known in the art. Suitable agitation methods include, but are not limited to, air sparging, work piece agitation, impingement, rotation and the like. When copper plating baths of the invention are used to plate TSVs in an electronic device substrate, such as wafer used in the manufacture of integrated circuits, the wafer may be rotated such as from 1 to 150 RPM. The electroplating bath of the invention contacts the rotating wafer, such as by pumping or spraying the bath onto the wafer. In the alternative, the wafer need not be rotated where the flow of the plating bath is sufficient to provide the desired metal deposit. Sufficient potential is applied for a period of time sufficient to fill the TSVs with copper, where the copper deposit in the TSVs is substantially void-free, and where the surface of the copper deposit is substantially free of surface defects. Suitable current density is in the range of from 0.1 to 50 mA/cm$^2$, and preferably from 0.4 to 6 mA/cm$^2$. Suitable plating times vary from 5 to 120 min., although such times depend on the particular TSV feature sizes. It will be appreciated by those skilled in the art that a first, relatively low current density may be used for a first period to initiate copper plating, followed by increasing the current density for a subsequent period. The current density may be increased continuously, or in a step-wise manner, in which two or more steps may be used. The optimal current density and duration are generally determined experimentally and may vary depending upon the aspect ratio and dimension of the TSV. Following copper plating, the plated substrate may optionally be rinsed, dried, and planarized before being subjected to subsequent processing steps.

The present copper electroplating baths provide superfilling, that is bottom-up-growth, of TSVs. In superfilling, copper is preferentially deposited in the bottom of a via, such as a TSV. Such bottom-up filling is critical to providing a substantially void-free, and preferably void-free, copper deposit in the via. The leveler and suppressor in the copper electroplating bath are used to slow the plating rate down at the surface of the substrate, while the accelerator enhances the plating rate at the bottom of the via. Balancing both the selection of and the amount of accelerator, suppressor, and leveler allows void-free via filling. It has been surprisingly found that the present suppressors, which provide a copper electroplating bath having a dynamic surface tension of ≤40 mN/m not only work to provide superfilling of TSVs, but also significantly reduce surface defects, such as swirl defects, on the resulting deposit.

EXAMPLE 1

Copper electroplating baths were prepared by first combining 63.5 g/L Cu$^{2+}$ (from CuSO$_4$.5H$_2$O), 10 g/L H$_2$SO$_4$, and 80 mg/L Cl$^-$ (from 1N HCl), and then adding 4.8 mL/L of an accelerator (sodium bis(sulfopropyl)disulfide) stock solution, 3.5 mL/L of a leveler (reaction product of imiazoles with diglcidyl ether) stock solution, and an amount of an aqueous suppressor stock solution. The suppressors evaluated are shown in Table 1, where sample numbers containing a "C" are comparative.

TABLE 1

| Sample No. | Suppressor Material | Trade name |
|---|---|---|
| C1 | Tetrafunctional EO/PO block copolymer formed from ethylenediamine core | |
| C2 | Alkyl capped EO/PO block copolymer (EO/PO = 1/1 w/w), $M_n$ = 750 | UCON ™ 50-HB-170 |
| C3 | Alkyl capped EO/PO block copolymer (EO/PO = 1/1 w/w), $M_n$ = 970 | UCON ™ 50-HB-260 |
| C4 | Alkyl capped EO/PO block copolymer (EO/PO = 1/1 w/w), $M_n$ = 1590 | UCON ™ 50-HB-660 |
| C5 | Alkyl capped EO/PO block copolymer (EO/PO = 1/1 w/w), $M_n$ = 3930 | UCON ™ 50-HB-5100 |
| 1 | Branched secondary alcohol ethoxylate, having 11 moles of EO | TERGITOL ™ TMN-10 |

EXAMPLE 2

The procedure of Example 1 is repeated except the suppressors listed in Table 2 are used.

TABLE 2

| Sample No. | Suppressor Material | Trade name |
|---|---|---|
| 2 | Branched secondary alcohol ethoxylate, having 8 moles of EO | TERGITOL ™ TMN-6 |
| 3 | Alkyl capped EO/PO copolymer (EO/PO = 1/1 w/w) | TERGITOL ™ XD |
| 4 | Alkyl capped EO/PO copolymer (EO/PO = 1/1 w/w) | TERGITOL ™ XH |
| 5 | 70:30 Blend of TERGITOL ™ TMN-10 and TERGITOL ™ TMN-6 surfactants | TERGITOL ™ TMN-100 |

EXAMPLE 3

Swirl defect testing was performed on 4×4 cm Q-cleave D (QCD) wafer coupons. The coupons were attached to the plating head of a segment plater with conductive copper tape, which was then covered by platers tape (3M, Minneapolis, Minn.). All coupons were subjected to a 5 min. deionized water spray prior to plating. Each wafer coupon acted as the cathode and was rotated by a Pine Instruments MSRX rotator at 50 rpm and was contacted with the electroplating bath from Example 1. The temperature of the electroplating bath was 25° C. The plating waveform used to monitor surface (swirl) defects is reported in Table 3, where CD is the current density.

TABLE 3

| | Cu Deposit thickness, Å | CD, mA/cm$^2$ | Time, min. |
|---|---|---|---|
| Hot entry | 0 | 0.1 | 0 |
| Step 1 | 1500 | 0.6 | 11.26 |
| Step 2 | 2000 | 1 | 9.01 |
| Step 3 | 2500 | 3 | 3.75 |
| Step 4 | 6000 | 5 | 5.41 |
| Total: | 12000 | | 29.43 |

Figure 1B:
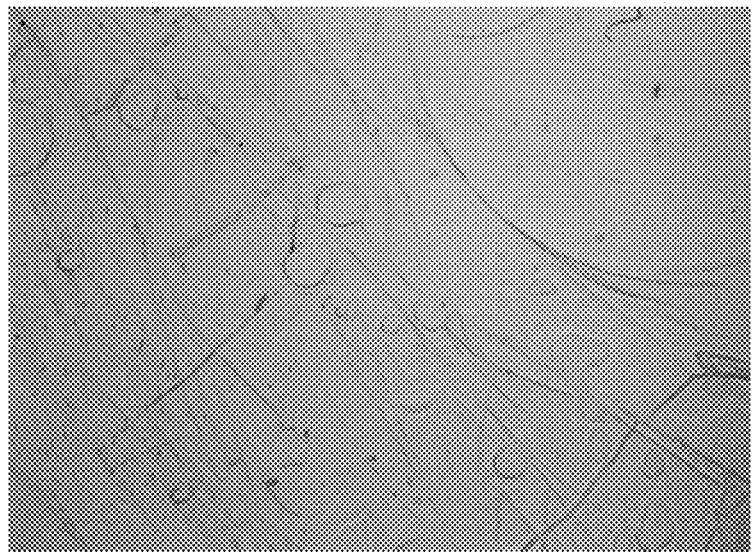

Each plated wafer coupon was evaluated for surface (swirl) defects using confocal microscope images obtained from a Leica DCM 3D microscope. Defect images were taken approximately 1 cm from each of the corners of the coupons as well as the center of each coupon. The concentration of the suppressors tested and the presence of surface (swirl) defects are reported in Table 5. In Table 5, a rating of "No" surface defects meant that no surface defects, particularly swirl defects, were observable, while a rating of "Yes" indicates the presence of swirl defects. FIG. 1A is an optical image of the copper deposit obtained from the copper electroplating bath having suppressor Sample 1 (invention). FIG. 1B is an optical image of the copper deposit obtained from the copper electroplating bath having suppressor Sample C1 (comparative). As can be seen from FIGS. 1A and 1B, the deposit obtained from the electroplating bath of the invention has no swirl defects, whereas the deposit obtained from the comparative electroplating bath (FIG. 1B) shows significant swirl defects.

EXAMPLE 4

Via fill testing was performed on various test wafer coupons having 10 μm diameter×100 μm deep TSVs. The coupons were attached to the plating head of a segment plater with conductive copper tape, which was then covered by platers tape (3M, Minneapolis, Minn.). All coupons were subjected to a 5 min. deionized water spray prior to plating. Each wafer coupon acted as the cathode and was rotated by a Pine Instruments MSRX rotator at 50 rpm and was contacted with the electroplating baths from Example 1. The temperature of the electroplating bath was 25° C. The plating waveform used to monitor surface (swirl) defects is reported in Table 4, where CD is the current density. The dynamic surface tension of each of the plating baths was measured at 25° C. using a Krüss BP100 bubble pressure tensiometer at a surface age of 30 sec. The surface tension measurements are reported in Table 5.

TABLE 4

| | Cu Deposit thickness, Å | CD, mA/cm$^2$ | Time, min. |
|---|---|---|---|
| Hot entry | 0 | 0.1 | 0 |
| Step 1 | 2000 | 0.48 | 18.77 |
| Step 2 | 3000 | 0.97 | 13.93 |
| Step 3 | 6450 | 2 | 14.53 |
| Step 4 | 6050 | 3 | 9.08 |
| Total: | 17500 | | 56.31 |

Following copper plating to fill the TSVs, the wafer coupons were cross-sectioned and imaged by optical microscopy. The optical images were evaluated to determine the filling ability of the plating bath. A rating of "Good" meant that the TSVs were completely filled with copper which was also void-free. A rating of "Poor" meant that completely filling of the TSV was not achieved. The results are reported in Table 5. Suppressor C1 was found to produce swirl defects having a height of from 50 to 250 nm

TABLE 5

| Suppressor Sample | Suppressor Concentration, mg/L | Surface Tension, mN/M | Surface Defects | TSV Filling |
|---|---|---|---|---|
| C1 | 35 | 52.3 | Yes | Good |
| C2 | 1500 | 47 | Yes | — |
| C3 | 13.4 | — | Yes | Good |
| | 610 | — | Yes | Good |
| | 1220 | 45.7 | Yes | Good |

TABLE 5-continued

| Suppressor Sample | Suppressor Concentration, mg/L | Surface Tension, mN/M | Surface Defects | TSV Filling |
|---|---|---|---|---|
| C4 | 22 | — | Yes | Good |
|  | 150 | — | Slightly Reduced | Good |
|  | 1000 | 43 | Slightly Reduced | Good |
| C5 | 4.4 | — | Yes | Good |
|  | 26.4 | — | Yes | Good |
|  | 54.4 | 41.6 | Reduced | Poor |
| 1 | 62.5 | 37.0 | No | Good |
|  | 100 | 33.4 | No | — |
| 2 | 100 | 30.4 | No | — |

As can be seen from Table 5, only the copper electroplating baths of the invention were able to completely fill TSVs with a void-free copper deposit, and provide a copper deposit that was free of surface defects. The copper electroplating bath containing Suppressor C5 in an amount of 54.4 mg/L was able to reduce, but not eliminate, swirl defects, but was then unable to completely fill the TSV.

EXAMPLE 5

Wafer coupons were plated according to the procedure of Example 4 using a copper electroplating bath from Example 1 containing either 75 ppm of suppressor Sample 1 (invention) or 35 ppm of suppressor Sample C1 (comparative). The plating waveform used is reported in Table 6.

TABLE 6

|  | Cu Deposit thickness, Å | CD, mA/cm² | Time, min. |
|---|---|---|---|
| Hot entry | 0 | 0.1 | 0 |
| Step 1 | 2000 | 0.60 | 15.02 |
| Step 2 | 2000 | 0.90 | 10.01 |
| Step 3 | 6350 | 2.4 | 11.92 |
| Step 4 | 7150 | 3.2 | 10.06 |
| Total: | 17500 |  | 47.01 |

Figure 2A:
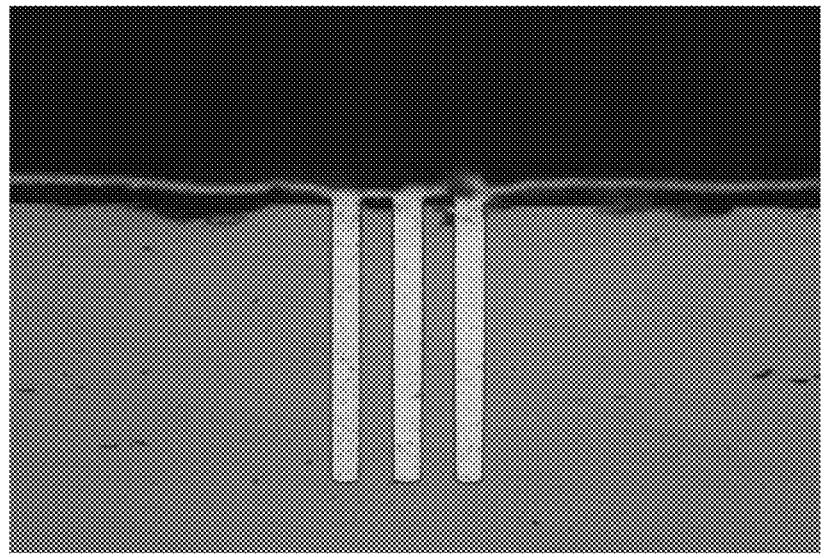
FIGS. 2A and 2B are cross-sectional optical images showing copper filled TSVs obtained from a copper electroplating bath having a suppressor of the invention and a copper electroplating bath having a comparative suppressor, respectively.
Figure 2B:
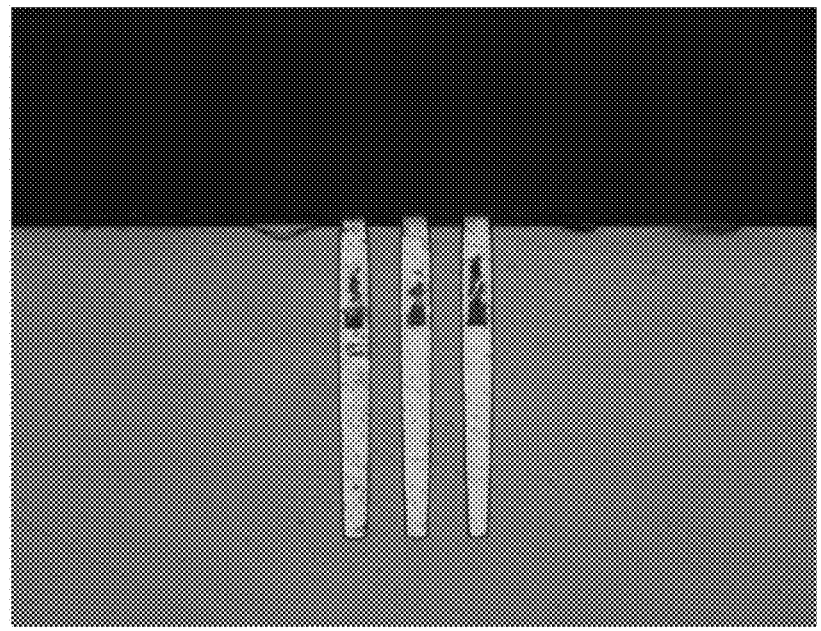

Following copper plating, the wafer coupons were cross-sectioned and imaged by optical microscopy. FIG. 2A is a cross-sectional optical image of the wafer plated using the inventive copper electroplating bath (suppressor Sample 1), and FIG. 2B is a cross-sectional optical image of the wafer plated using the comparative copper electroplating bath (suppressor Sample C1). FIG. 2A shows void-free copper filled TSVs while FIG. 2B shows copper filled TSVs having significant voids.

What is claimed is:

1. A method of filling a via in an electronic device with copper comprising: providing an acidic copper electroplating bath comprising a source of copper ions, an acid electrolyte, a source of halide ions, an accelerator, a leveler, and a suppressor, wherein the copper electroplating bath has a dynamic surface tension of ≤40 mN/m; providing as a cathode an electronic device substrate having one or more vias to be filled with copper and having a conductive surface; contacting the electronic device substrate with the copper electroplating bath; and applying a potential for a period of time sufficient to fill the vias with a copper deposit; wherein the copper deposit is substantially void-free and substantially free of surface defects; and wherein the suppressor is a branched secondary alcohol ethoxylate.

2. The method of claim 1 wherein the electronic device is a wafer or a die.

3. The method of claim 1 wherein the copper electroplating bath has a pH of ≤2.

4. The method of claim 1 wherein the conductive surface is a seed layer.

5. The method of claim 4 wherein the seed layer is a copper seed layer.

6. The method of claim 1 wherein the suppressor further comprises propylene oxide as polymerized units.

7. The method of claim 1 wherein the copper deposit is void-free and free of swirl defects.

8. A copper electroplating bath composition comprising: a source of copper ions; an acid electrolyte; a source of halide ions; an accelerator; a leveler; and a suppressor; wherein the copper electroplating bath has a dynamic surface tension of ≤40 mN/m; wherein the copper electroplating bath is acidic; and wherein the suppressor is a branched secondary alcohol ethoxylate.

9. The composition of claim 8 wherein the suppressor is present in an amount of from 0.5 to 500 ppm.

10. A copper electroplating bath composition comprising: a source of copper ions; an acid electrolyte; a source of halide ions; an accelerator; a leveler; and a suppressor; wherein the copper electroplating bath has a surface tension of ≤40 mN/m; and wherein the suppressor is a branched secondary alcohol ethoxylate.

11. A method of filling a via in an electronic device with copper comprising: providing as a cathode an electronic device substrate having one or more vias to be filled with copper and having a conductive surface; contacting the electronic device substrate with the copper electroplating bath of claim 10; and applying a potential for a period of time sufficient to fill the vias with a copper deposit; wherein the copper deposit is substantially void-free and substantially free of surface defects.

* * * * *